(12) United States Patent
Cheng et al.

(10) Patent No.: US 9,167,696 B2
(45) Date of Patent: Oct. 20, 2015

(54) LOW PROFILE MEMORY MODULE

(71) Applicants: Mark Kuanyu Cheng, Fountain Valley, CA (US); Mark Burlington, Aliso Viejo, CA (US); Henry Hai Dang Nguyen, Fountain Valley, CA (US)

(72) Inventors: Mark Kuanyu Cheng, Fountain Valley, CA (US); Mark Burlington, Aliso Viejo, CA (US); Henry Hai Dang Nguyen, Fountain Valley, CA (US)

(73) Assignee: Kingston Technology Corporation, Fountain Valley, CA (US)

( * ) Notice: Subject to any disclaimer, the term of this patent is extended or adjusted under 35 U.S.C. 154(b) by 0 days.

(21) Appl. No.: 14/094,605

(22) Filed: Dec. 2, 2013

(65) Prior Publication Data

US 2014/0153201 A1 Jun. 5, 2014

Related U.S. Application Data

(60) Provisional application No. 61/732,331, filed on Dec. 1, 2012, provisional application No. 61/800,483, filed on Mar. 15, 2013.

(51) Int. Cl.
*H01R 9/00* (2006.01)
*H05K 1/18* (2006.01)
*G06F 1/16* (2006.01)
*H05K 1/14* (2006.01)
*H01R 12/71* (2011.01)

(52) U.S. Cl.
CPC .............. *H05K 1/141* (2013.01); *H01R 12/716* (2013.01); *H05K 2201/10159* (2013.01); *H05K 2201/10189* (2013.01)

(58) Field of Classification Search
CPC .............. H01R 9/09; H05K 1/181; G06F 1/16
USPC .................. 361/748, 679.31, 679.32; 439/629
See application file for complete search history.

(56) References Cited

U.S. PATENT DOCUMENTS 5,885,092 A * 3/1999 Ito et al. ............................ 439/74
5,921,787 A * 7/1999 Pope et al. ....................... 439/74
(Continued)

OTHER PUBLICATIONS

JEDEC, JEDEC Standard No. 21C, p. 40.2.17-1, PC3-12800 DDR3 Unbuffered MicroDIMM Reference Design Specification, Revision 0.32, Feb. 2007.*

(Continued)

*Primary Examiner* — Jeremy C Norris
*Assistant Examiner* — Nathan Milakovich
(74) *Attorney, Agent, or Firm* — Law Offices of S.J. Christine Yang; Victoria Hao

(57) ABSTRACT

An electronic component module according to an embodiment of the present invention includes a printed circuit board including a low-profile plug and at least one memory component thereon, and a connector for connecting the printed circuit board to a motherboard, the connector being mateable with the plug on the printed circuit board and having a z-height of no more than about 1.5 mm. The low-profile plug includes one hundred seventy pins and the number of pins allocated for VSS is no more than twenty-two and the number of pins allocated for VDD is no more than sixteen. Further, the low-profile plug includes an insulative portion protruding from a surface of the printed circuit board and having a "⊓"-like or inverted "凹"-like profile in its center. The connector includes two sub-connectors, and an insulative portion having a "ш"-like or inverted "m"-like profile in the center.

19 Claims, 23 Drawing Sheets

(56) References Cited

U.S. PATENT DOCUMENTS

| | | | |
|---|---|---|---|
| 5,975,916 A * | 11/1999 | Okura | 439/74 |
| 6,203,338 B1 * | 3/2001 | Choy | 439/83 |
| 6,394,823 B1 * | 5/2002 | Dunham et al. | 439/108 |
| 6,623,308 B2 * | 9/2003 | Ono | 439/680 |
| 6,764,314 B1 * | 7/2004 | Lee | 439/65 |
| 6,881,075 B2 * | 4/2005 | Huang et al. | 439/74 |
| 6,986,670 B2 * | 1/2006 | Okura et al. | 439/74 |
| 7,112,091 B2 * | 9/2006 | Okura et al. | 439/570 |
| 7,931,477 B2 * | 4/2011 | Hirata et al. | 439/74 |
| 8,888,506 B2 * | 11/2014 | Nishimura et al. | 439/74 |
| 2009/0006659 A1 * | 1/2009 | Collins et al. | 710/8 |
| 2014/0185226 A1 * | 7/2014 | Lam et al. | 361/679.31 |

OTHER PUBLICATIONS

JEDEC, JEDEC Standard JESD212, GDDR5 SGRAM, Dec. 2009.*

* cited by examiner

FIGURE 1
(Related Art)

| Pin# | Front Side | Pin# | Back Side |
|---|---|---|---|
| 1 | VREFDQ | 86 | VSS |
| 2 | VSS | 87 | DQ4 |
| 3 | DQ12 | 88 | DQ5 |
| 4 | DQ13 | 89 | DQ0 |
| 5 | DQ8 | 90 | DQ1 |
| 6 | DQ9 | 91 | DM0 |
| 7 | DM1 | 92 | DQS0# |
| 8 | DQS1# | 93 | DQS0 |
| 9 | DQS1 | 94 | VSS |
| 10 | VSS | 95 | DQ6 |
| 11 | DQ14 | 96 | DQ7 |
| 12 | DQ15 | 97 | DQ2 |
| 13 | DQ10 | 98 | DQ3 |
| 14 | DQ11 | 99 | VSS |
| 15 | VSS | 100 | DQ20 |
| 16 | DQ28 | 101 | DQ21 |
| 17 | DQ29 | 102 | DQ16 |
| 18 | DQ24 | 103 | DQ17 |
| 19 | DQ25 | 104 | DM2 |
| 20 | DM3 | 105 | DQS2# |
| 21 | DQS3# | 106 | DQS2 |
| 22 | DQS3 | 107 | VSS |
| 23 | VSS | 108 | DQ22 |
| 24 | DQ30 | 109 | DQ23 |
| 25 | DQ31 | 110 | DQ18 |
| 26 | DQ26 | 111 | DQ19 |
| 27 | DQ27 | 112 | VSS |
| 28 | VSS | 113 | VSS |
| 29 | NC | 114 | RESET# |
| 30 | VDD | 115 | VDD |
| 31 | CKE0 | 116 | CKE1 |
| 32 | A14 | 117 | A15 |
| 33 | VDD | 118 | VDD |
| 34 | A12/BC | 119 | BA2 |
| 35 | A11 | 120 | A9 |
| 36 | VDD | 121 | VDD |
| 37 | A8 | 122 | A7 |
| 38 | A5 | 123 | A6 |
| 39 | VDD | 124 | VDD |
| 40 | A3 | 125 | A4 |
| 41 | A2 | 126 | A1 |
| 42 | VDD | 127 | VDD |
| 43 | CK1 | 128 | CK0 |
| 44 | CK1# | 129 | CK0# |
| 45 | VDD | 130 | VDD |
| 46 | A10 | 131 | A0 |
| 47 | BA0 | 132 | BA1 |
| 48 | VDD | 133 | VDD |
| 49 | S0# | 134 | RAS# |
| 50 | CAS# | 135 | WE# |
| 51 | VDD | 136 | VDD |
| 52 | A13 | 137 | ODT0 |
| 53 | ODT1 | 138 | S1# |
| 54 | VSS | 139 | VREFCA |
| 55 | VSS | 140 | VSS |
| 56 | DQ36 | 141 | DQ44 |
| 57 | DQ37 | 142 | DQ45 |
| 58 | DQ32 | 143 | DQ40 |
| 59 | DQ33 | 144 | DQ41 |
| 60 | DM4 | 145 | DM5 |
| 61 | DQS4# | 146 | DQS5# |
| 62 | DQS4 | 147 | DQS5 |
| 63 | VSS | 148 | VSS |
| 64 | DQ38 | 149 | DQ46 |
| 65 | DQ39 | 150 | DQ47 |
| 66 | DQ34 | 151 | DQ42 |
| 67 | DQ35 | 152 | DQ43 |
| 68 | VSS | 153 | VSS |
| 69 | DQ52 | 154 | DQ60 |
| 70 | DQ53 | 155 | DQ61 |
| 71 | DQ48 | 156 | DQ56 |
| 72 | DQ49 | 157 | DQ57 |
| 73 | DM6 | 158 | DM7 |
| 74 | DQS6# | 159 | DQS7# |
| 75 | DQS6 | 160 | DQS7 |
| 76 | VSS | 161 | VSS |
| 77 | DQ54 | 162 | DQ62 |
| 78 | DQ55 | 163 | DQ63 |
| 79 | DQ50 | 164 | DQ58 |
| 80 | DQ51 | 165 | DQ59 |
| 81 | VSS | 166 | VSS |
| 82 | SA0 | 167 | EVENT# |
| 83 | VDDSPD | 168 | SDA |
| 84 | SA1 | 169 | SCL |
| 85 | VTT | 170 | VTT |

FIGURE 5

DQ0-DQ7,DQS0+/-,DM0 (Read 1.35V, 1600Mbps at D0)
* PCB + IBIS models (msd_rcv3l_odt40)
  * Bit width : 480ps DQ8-DQ15,DQS1+/-,DM1 (Read 1.35V, 1600Mbps at D0)
- PCB + IBIS models (msd_rcv3l_odt60)
  - Bit width : 471ps DQ8-DQ15,DQS1+/-,DM1 (Read 1.35V, 1600Mbps at D0)
- PCB + IBIS models (msd_rcv3l_odt120)
  - Bit width : 348ps

LOW PROFILE MEMORY MODULE

CROSS-REFERENCE TO RELATED APPLICATIONS

This application claims priority to U.S. Provisional Patent Application No. 61/732,331, filed on Dec. 1, 2012, and U.S. Provisional Patent Application No. 61/800,483, filed on Mar. 15, 2013, the entire disclosure of which are hereby incorporated by reference herein.

BACKGROUND OF THE INVENTION

1. Field of the Invention

The present invention relates to memory modules and more specifically, to dynamic random-access memory ("DRAM") modules that have low profile or for implementation in low-profile applications. The present invention also relates to memory modules with a smaller connector or a reduced number of pins while maintaining sufficient power delivery and ground return.

2. Discussion of the Related Art

Electronic components are generally assembled into modules. Modules, for example, memory modules, may be physically and electrically coupled to a printed circuit board assembly ("PCBA") to form an electronic assembly. These assemblies may then be incorporated into a variety of electronic systems such as computers, communication devices, and recreational devices, including desktops, laptops, notebooks, tablets, handhelds, servers, Internet appliances, mobile phones, televisions, video game consoles, compact disc players, MP3 players, and the like.

The main memory in personal computers, servers, and video game consoles, commonly utilizes dynamic random-access memory ("DRAM"). One advantage of DRAM is its structural simplicity: DRAM conventionally stores each bit of data in a separate capacitor. Thus, conventionally only one transistor and a capacitor are required per bit in DRAM as compared to four or six transistors in static random-access memory ("SRAM"). This allows DRAM to achieve very high densities. For example, billions of transistors and capacitors can fit on a single memory chip.

To further increase the memory capacity onto a memory module, single in-line memory modules ("SIMMs") and dual in-line memory modules ("DIMMs") have been developed where each module contains a number of memory chips on one PCBA. In a SIMM, the pins for communicating to the memory chips are located on the lower edge of the front and back surfaces of the SIMM, and these pins are redundant and connected, thereby providing a single line of communication paths between the module and a host system. In contrast, the contacts or pins on the lower edge of the front and back surfaces of a DIMM are not connected, providing two lines of communication paths between the module and a host system. For example, a DIMM has one communication path in the front surface and one communication path in the back surface. In turn, SIMMs and DIMMs are not interchangeable, have different sizes and require different types of sockets to be provided by the host system.

As consumers often desire smaller and more compact electronic devices, electronic manufacturers desire not just increased component capacity but also decreased component sizes. However, the smaller electronic devices challenge technology as they pit performance against size, requiring reduction, compaction or miniaturization of the electronic components to realize the size restrictions. Modifications to surface areas to DIMMs have been suggested. For example, there have been small outline dual in-line memory modules ("SODIMMs"). Also, micro dual in-line memory modules ("MicroDIMMs") have smaller surface areas as compared to a conventional DIMM and a SODIMMs. MicroDIMMs has been roughly half size of the surface area of a conventional DIMM.

To increase components or parts compatibility, industries have formed standard setting bodies or associations to promote uniformity in certain component dimensions or functions. For example, JEDEC, formerly known as the Joint Electron Device Engineering Council, has standardized surface areas and numbers of pins for SIMMs and DIMMs. As shown in Table 1, JEDEC has established 200 pins as a 'standard' format for SODIMMs, and 214 pins as a 'standard' format for MicroDIMMs.

TABLE 1

|         | 200-pin SODIMM (related art) | 214-pin MicroDIMM (related art) |
|---------|------------------------------|---------------------------------|
| # of Pins | 200                        | 214                             |

FIG. 1 is a chart reflecting the pin assignment for a 240-pin MicroDIMM module according to the related art. As shown in FIG. 1, the related art uses two hundred fourteen (214) pins for a MicroDIMM. More specifically, the related art has sixteen (16) pins are for core and input/output ("I/O") power, fifty-six (56) pins for ground, and eleven (11) pins for no-connect. "DDR3" refers to double data rate three, where data can be transferred on both the rising and the falling edges of each clock signal between a host and the memory module.

Nonetheless, mechanical outlines of electronic components, such as the seating height of a module, has been a focus as each new generation of packaging must provide improved performance, while reducing or compacting package size. For example, laptops, notebooks and tablet devices, which are becoming increasing popular, are small and demand low profile and high performance. Thus, a particular need also continues to exist to reduce the size of the high-speed memory components necessary to support state-of-the-art software applications while maintaining or even improving memory performance. For example, a particular need exists to reduce device thickness while supporting faster data speed.

SUMMARY OF THE INVENTION

Accordingly, embodiments of the invention are directed to a memory module and a connector for providing connection between a memory module and a motherboard that can substantially obviate one or more of the problems due to limitations and disadvantages of the related art.

One aspect of the embodiments of the invention relates to a novel method and device for providing low-profile memory module for implementation in small electronic devices, such as laptops, notebooks and tablet devices, to address the size restrictions inherent in such applications.

Another aspect of the embodiments of the invention relates a novel method and device for a micro dual in-line memory module ("MicroDIMM") with low profile to address the size restrictions inherent in thin electronic device applications.

Another aspect of the disclosed subject matter pertains to a novel method and device for providing a reduced pin count memory module package specifically applicable to low profile applications.

Another aspect of the disclosed subject matter pertains to a novel method and device for reducing the number of power pins and ground pins while maintaining sufficient power delivery and ground return.

Another aspect of the disclosed subject matter pertains to a novel method and device with a pin-out selection for a MicroDIMM that provides a greater number of data lines while keeping proper impedance.

An aspect of the embodiments of the invention relates to a novel method and device for providing a low-profile connector for a memory module for implementation in small electronic devices, such as laptops, notebooks and tablet devices, to address the size restrictions inherent in such applications.

Another aspect of the embodiments of the invention relates a novel method and device for a low-profile connector for a MicroDIMM to address the size restrictions inherent in thin electronic device applications.

Another aspect of the disclosed subject matter pertains to a novel method and device for providing a low-profile connector for accommodating a reduced pin count memory module package specifically applicable to low profile applications.

Another aspect of the disclosed subject matter pertains to a novel method and device for reducing the number of power pins and ground pins in a low-profile connector, while maintaining sufficient power delivery and ground return.

Another aspect of the disclosed subject matter pertains to a novel pin design for a low-profile connector to ensure contact of the pins and provides enhanced pin contacts of a memory module in low profile applications.

Another aspect of the disclosed subject matter pertains to a novel pin design for a low-profile connector that offers margin for misalignment of a memory module with a motherboard.

Another aspect of the disclosed subject matter pertains to a novel structure design for a low-profile connector that provide enhanced structural stability for a memory module when the memory module is mounted on a motherboard.

An aspect of the embodiments of the invention relates to a novel method and device for providing a plug for a memory module for implementation in small electronic devices, such as laptops, notebooks and tablet devices, to address the size restrictions inherent in such applications.

Another aspect of the embodiments of the invention relates a novel method and device for a plug for a MicroDIMM to address the size restrictions inherent in thin electronic device applications.

Another aspect of the disclosed subject matter pertains to a novel method and device for providing a plug for a memory module for accommodating a reduced pin count memory module package specifically applicable to low profile applications.

Another aspect of the disclosed subject matter pertains to a novel pin design for a plug to ensure contact of the pins and provides enhanced pin contacts of a memory module in low profile applications.

Another aspect of the disclosed subject matter pertains to a novel pin design for a plug that offers margin for misalignment of a memory module with a motherboard.

Additional features and advantages of embodiments of the invention will be set forth in the description which follows, and in part will be apparent from the description, or may be learned by practice of embodiments of the invention. The objectives and other advantages of the embodiments of the invention will be realized and attained by the structure particularly pointed out in the written description and claims hereof as well as the appended drawings.

To achieve these and other advantages and in accordance with the purpose of embodiments of the invention, as embodied and broadly described, an electronic component module according to an embodiment of the present invention includes a printed circuit board including a plug and at least one memory component thereon, and a connector for connecting the printed circuit board to a motherboard, the connector being mateable with the plug on the printed circuit board and having a z-height of no more than about 1.5 mm.

In addition, an electronic component module according to an embodiment of the present invention includes a printed circuit board including a plug and at least one memory component thereon, and a connector for connecting the printed circuit board to a motherboard, wherein the plug includes pins and the number of pins allocated for VSS is no more than twenty-two and the number of pins allocated for VDD is no more than sixteen.

Further, an electronic component module according to an embodiment of the present invention includes a printed circuit board including a plug and at least one memory component thereon, and a connector for connecting the printed circuit board to a motherboard, wherein the plug includes an insulative portion protruding from a surface of the printed circuit board and having a "⊓"-like or inverted "凹"-like profile in its center.

An electronic component module according to an embodiment of the present invention includes a printed circuit board including a plug and at least one memory component thereon, and a connector for connecting the printed circuit board to a motherboard, wherein each of the connector and the plug has one hundred seventy pins, respectively, and each of the pins of the plug is a cantilever pin.

An electronic component module according to an embodiment of the present invention includes a printed circuit board including a plug and at least one memory component thereon, and a connector for connecting the printed circuit board to a motherboard, wherein each of the connector and the plug has one hundred seventy pins, respectively with the pin pitch to be about 0.5 mm, and wherein each of the pins of the plug includes a hook portion.

An electronic component module according to an embodiment of the present invention includes a printed circuit board including a plug and at least one memory component thereon, and a connector for connecting the printed circuit board to a motherboard, wherein the thickness of the printed circuit board is no more than about 3.7 mm maximum.

A MicroDIMM according to an embodiment of the present invention includes a printed circuit board, a plug on the printed circuit board, and at least one memory component on the printed circuit board, wherein the plug has a z-height less than 1.5 mm.

In addition, a MicroDIMM according to an embodiment of the present invention includes a printed circuit board, a plug on the printed circuit board, and at least one memory component on the printed circuit board, wherein the plug includes pins and the number of pins allocated for VSS is no more than twenty-two and the number of pins allocated for VDD is no more than sixteen.

Further, a MicroDIMM according to an embodiment of the present invention includes a printed circuit board, a plug on the printed circuit board, and at least one memory component on the printed circuit board, wherein the plug includes an insulative portion protruding from a surface of the printed circuit board and having a "⊓"-like or inverted "凹"-like profile in its center.

A MicroDIMM according to an embodiment of the present invention includes a printed circuit board, a plug on the printed circuit board, and at least one memory component on the printed circuit board, wherein the plug has one hundred seventy pins, and wherein each of the pins of the plug is a cantilever pin.

In addition, a MicroDIMM according to an embodiment of the present invention includes a printed circuit board, a plug on the printed circuit board, and at least one memory component on the printed circuit board, wherein the plug has one hundred seventy pins, and wherein each of the pins of the plug includes a hook portion.

A connector for providing connection between a printed circuit board and a motherboard according to an embodiment of the present invention includes a z-height of no more than about 1.5 mm, and one hundred seventy pins, wherein each of the pins includes a hook portion.

In addition, a connector for providing connection between a printed circuit board and a motherboard according to an embodiment of the present invention includes a z-height of no more than about 1.5 mm, and one hundred seventy pins, wherein the connector includes two sub-connectors, and each of the two sub-connectors has 85 pins.

A connector for providing connection between a printed circuit board and a motherboard according to an embodiment of the present invention includes a z-height of no more than about 1.5 mm, and one hundred seventy pins, wherein the number of pins allocated for VSS is no more than twenty-two and the number of pins allocated for VDD is no more than sixteen.

Further, a connector for providing connection between a printed circuit board and a motherboard according to an embodiment of the present invention includes a z-height of no more than about 1.5 mm, and one hundred seventy pins, wherein the connector includes an insulative portion having a "ш"-like or inverted "m"-like profile in the center.

It is to be understood that both the foregoing general description and the following detailed description are exemplary and explanatory, which are intended to provide further explanation of embodiments of the invention as claimed.

BRIEF DESCRIPTION OF THE DRAWINGS

The accompanying drawings, which are included to provide a further understanding of embodiments of the invention and together with the descriptions serve to explain the principles of embodiments of the invention.

FIG. 1 is a chart reflecting the pin assignment for a 240-pin MicroDIMM module according to the related art.

FIG. 5 is a chart reflecting a pin assignment for a 170-pin MicroDIMM module according to an embodiment of the present invention.

DETAILED DESCRIPTION OF EXEMPLARY EMBODIMENTS

Reference will now be made in detail to the preferred embodiments of the invention, examples of which are illustrated in the accompanying drawings.

Figure 2A:
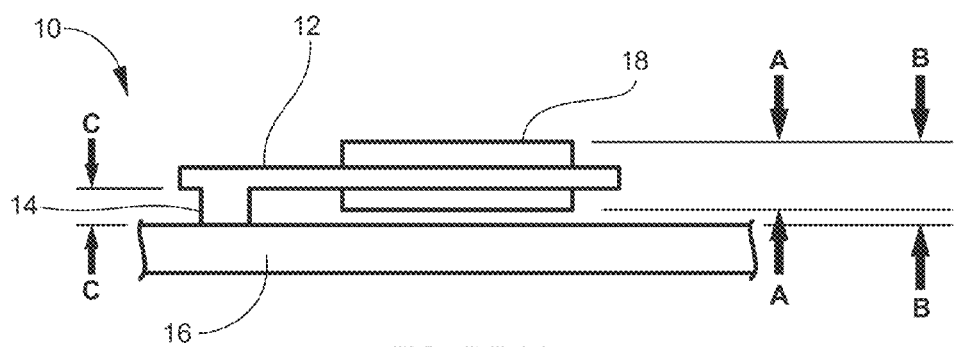
FIG. 2A is a cross-sectional view illustrating a MicroDIMM module mounted on a motherboard according to an embodiment of the present invention.
Figure 2B:
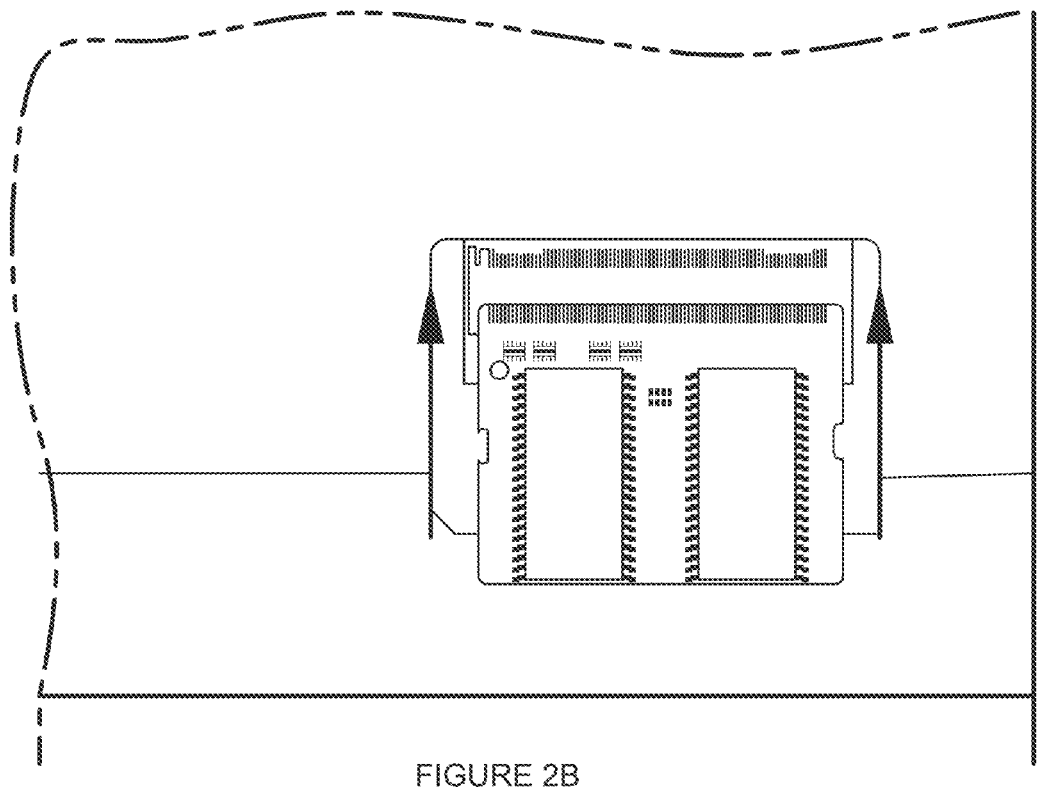
FIG. 2B is a top view illustrating how a MicroDIMM module with a low-profile connector according to an embodiment of the present invention can be incorporated in a system.

FIG. 2A is a cross-sectional view illustrating a MicroDIMM module mounted on a motherboard according to an embodiment of the present invention, and FIG. 2B is a top view illustrating how a MicroDIMM module with a low-profile connector according to an embodiment of the present invention can be incorporated in a system.

As illustrated in FIG. 2A, a MicroDIMM module 10 includes a MicroDIMM printed circuit board (PCB) 12. A low-profile connector 14 may be pre-affixed on a motherboard 16 so that the MicroDIMM module 10 is mounted on the motherboard 16. The motherboard 16 may be a PCB and may have a larger surface space than the MicroDIMM PCB 12. For example, the motherboard 16 may be a printed circuit board assembly ("PCBA") and may hold or contain electronic components in addition to the MicroDIMM PCB 12.

As illustrated in FIG. 2B, a MicroDIMM module with a low-profile connector according to an embodiment of the present invention may slide into a device having a motherboard and mounted onto the motherboard via a connector. For example, the device is a laptop, a notebook or a tablet device, and the motherboard is held within such a device. As illustrated in FIG. 2B, the motherboard does not require special modifications to use the MicroDIMM module or the low-profile connector according an embodiment of the present invention. For example, the MicroDIMM module can be mounted on any region of the motherboard and does not require any cutout or special cutout areas to be reserved on the motherboard for mounting.

Turning back to FIG. 2A, the MicroDIMM module 10 may have a z-thickness illustrated by A-A. For example, the MicroDIMM module 10 may have about 3.40 mm as its nominal z-thickness. The z-thickness of the MicroDIMM module 10 is taken into the thickness of the MicroDIMM PCB 12 and components thereon. According to an embodiment of the present invention, the MicroDIMM module may have no more than 3.70 mm as its z-thickness, illustrated by B-B.

The MicroDIMM PCB 12 includes one or more memory components 18 affixed thereto. The memory components 18 may include DRAMs, and more specifically DDR SDRAMs. Further, the memory components 18 may be affixed to both upper and lower surfaces of the MicroDIMM PCB 12. Alternatively, all of the memory components 18 (not shown in FIG. 2) may be affixed to one of the upper and lower surfaces of the MicroDIMM PCB 12.

Figure 3A:
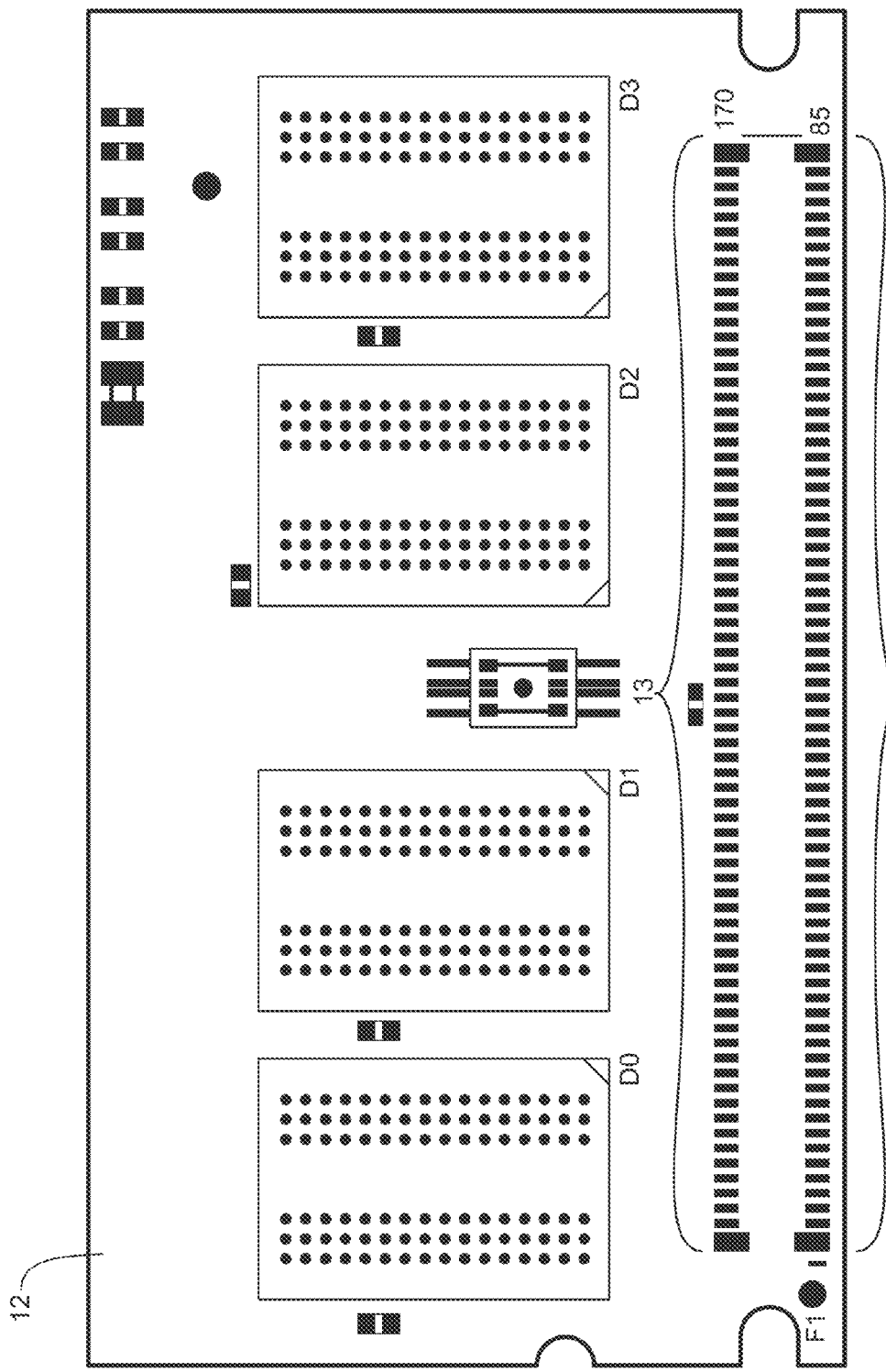
FIG. 3A is a plan view illustrating one side of a MicroDIMM printed circuit board ("PCB") according to an embodiment of the present invention before the memory components or other integrated circuits have been attached.
Figure 3B:
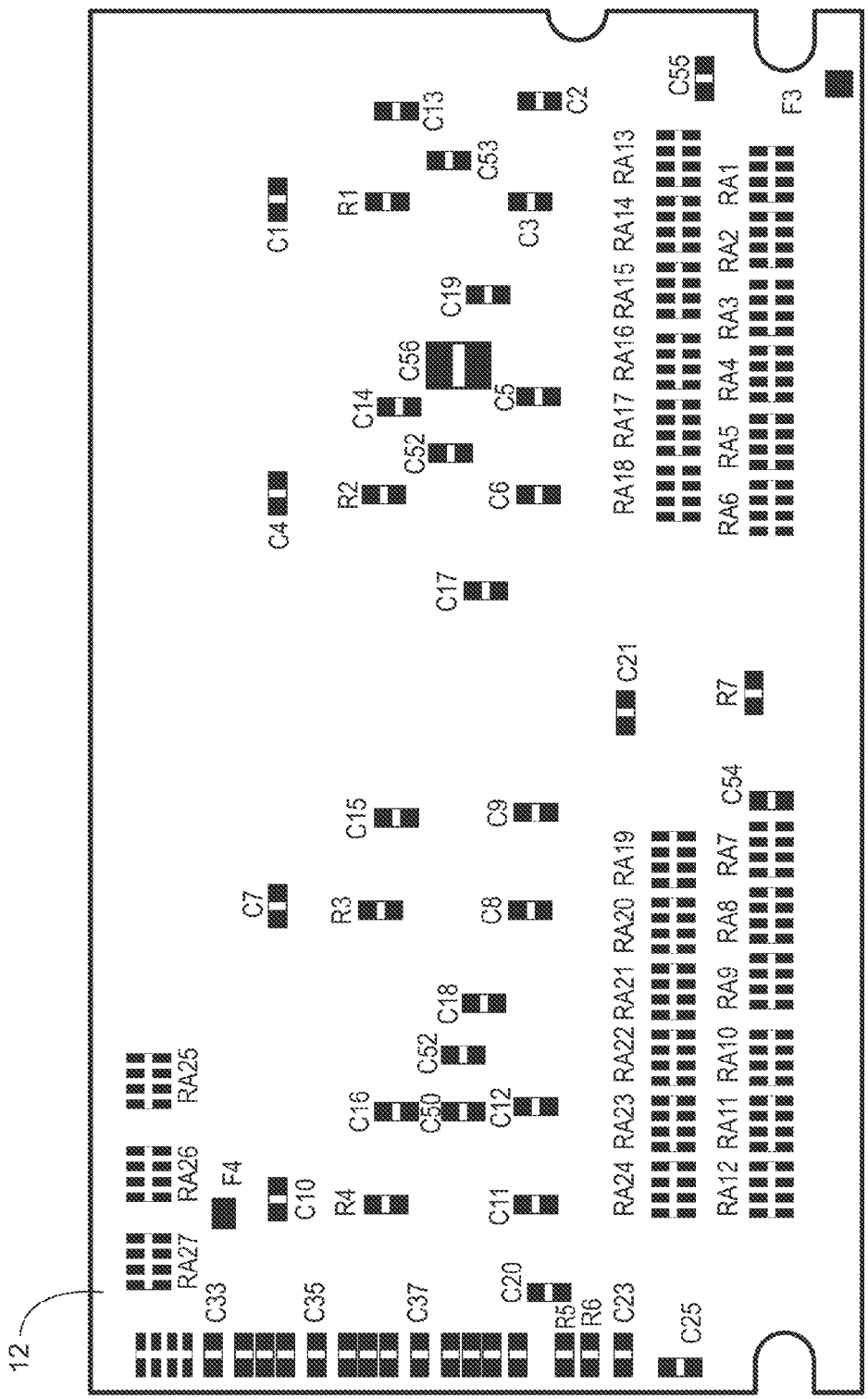
FIG. 3B is a plan view illustrating the opposite side of the MicroDIMM PCB illustrated in FIG. 3A.
Figure 3C:
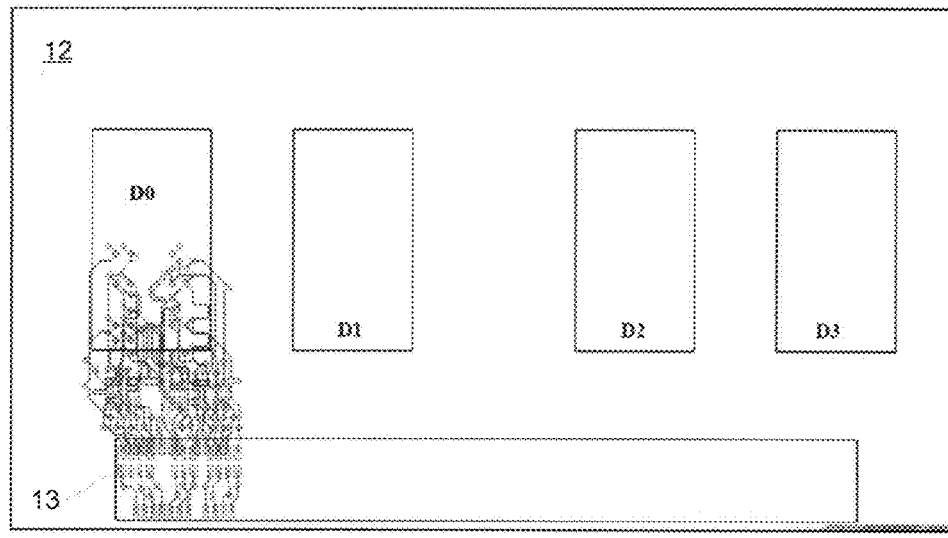
FIG. 3C is a plan view illustrating a layout of the side of the MicroDIMM printed circuit board ("PCB") according to an embodiment of the present invention illustrated in FIG. 3A.

FIG. 3A is a plan view illustrating one side of a MicroDIMM printed circuit board ("PCB") according to an embodiment of the present invention before the memory components or other integrated circuits have been attached, and FIG. 3B is a plan view illustrating the opposite side of the MicroDIMM PCB illustrated in FIG. 3A. FIG. 3C is a plan view illustrating a layout of the side of the MicroDIMM printed circuit board ("PCB") according to an embodiment of the present invention illustrated in FIG. 3A.

As illustrated in FIG. 3A, the MicroDIMM PCB 12 has reserved space D0-D3 for four memory components 18 (not shown in FIG. 2) on one of its upper and lower surfaces. The MicroDIMM PCB 12 may be considered as a printed circuit board assembly ("PCBA").

The dimensions of MicroDIMM PCB 12 may be preferably about 54 mm×about 30 mm. Alternatively, the dimensions of MicroDIMM PCB 12 may be preferably about 54 mm×about 36 mm. The MicDIMM PCB 12 may not have any PCB cut out. The write voltage for MicroDIMM PCB 12 may be preferably 1.5V or 1.35 V. Further, the MicroDIMM PCB 12 preferably supports data transfer rate of 1600 Mbps or 1866 Mbps.

Further, the MicroDIMM PCB 12 is a type of dual in-line memory modules, and includes a first set of pins 13 arranged in two rows. As illustrated in FIG. 3A, the first set of pins 13 may be located on the same surface, for example, one of the upper and lower surfaces of the MicroDIMM PCB 12. Although not shown, the first set of pins 13 may be located on different surface, for example, both of the upper and lower surfaces of the MicroDIMM PCB 12. The first sets of pins 13 preferably are located along a lower edge of the upper or lower surface of the MicroDIMM PCB 12. The number of the first set of pins 13 preferably is 170. The pin pitch of the first set of pins 13 preferably is about 0.5 mm.

As illustrated in FIG. 3B, another surface of the MicroDIMM PCB 12 may have reserved space for electronic components, for example, resistors, capacitors and/or fuses for managing signals for the MicroDIMM module 10. FIG. 3C illustrates one layout for the MicroDIMM PCB 12. In particular, the lines refer to the traces for data strobe (DQ0-DQ15), data strobe complement (DQS0, DQS1) and input data mask (DM0 and DM1) for one memory 18 (not shown) located in the memory reserved space D0. For example, the memory 18 (not shown) if subsequently soldered onto the reserved space D0, the memory 18 can communicate with a motherboard 16 through these traces, and can operate at a writing voltage of 1.35V and a data transfer speed of 1600 Mbps or faster.

Turning back to FIG. 2A, the low-profile connector 14 provides a connection between the MicroDIMM PCB 12 and the motherboard 16. The low-profile connector 14 may have a vertical portion arising above an upper surface of the motherboard 16. As shown in FIG. 2A, the low-profile connector 14 may have a z-height or a seat height illustrated by C-C. For example, the low-profile connector 14 preferably may have the z-height of about 1.5 mm.

Figure 4:
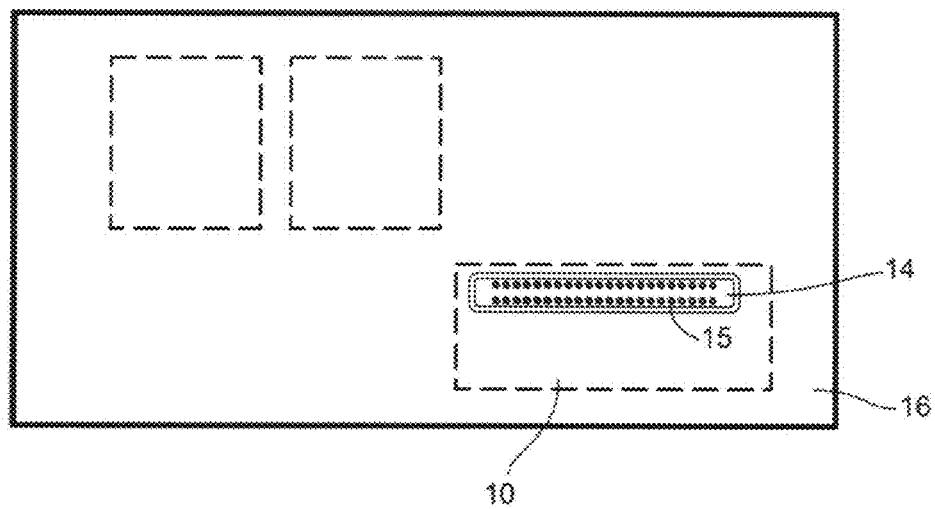
FIG. 4 is a top view illustrating a low-profile connector on a motherboard according to an embodiment of the present invention before a MicroDIMM is connected thereto.

FIG. 4 is a top view illustrating a low-profile connector on a motherboard according to an embodiment of the present invention before a MicroDIMM is connected thereto. The low-profile connector 14 includes a second set of pins 15 for connecting the MicroDIMM module 10 and the motherboard 16. As illustrated in FIG. 4, the second set of pins 15 are extended from a side surface of the low-profile connector 14 and are substantially perpendicular to the upper surface of the motherboard 16. Further, the second set of pins 15 are arranged in two rows to correspond to the first set of pins 13 on the MicroDIMM module 10. The number of the second set of pins 15 preferably corresponds to the number of the first set of pins 13 and is 170. The pin pitch of the second set of pins 15 preferably is about 0.5 mm.

By reducing the z-height of the low-profile connector 14, the profile of the motherboard 16 with the MicroDIMM module 10 mounted thereon is subsequently reduced. As a result, an electronic device (not shown), that subsequently incorporates the MicroDIMM module 10, also can have a lower and thinner profile. However, as the profile of the low-profile connector 14 reduces, the space that the low profile connector 14 can support pin outs of a memory PCB also reduces. For example, if the width of the low-profile connector 14 is reduced, the number of the second set of pins 15 that can be arranged in a row reduces and/or the pin pitch reduces.

Similarly, if the z-height of the low-profile connector 14 is reduced, the distance between of the two rows of the second set of pins 15 shortens, which could create signal interferences, and/or the pin length reduces, which could reduce data transfer efficiency. Further, if the z-height of the low-profile connector 14 is reduced too small, the low-profile connector 14 would no longer be able to support certain memory components 18 due to the thickness of such memory components 18 exceeding the clearance that the low-profile connector 14 could provide.

JEDEC has established 4.0 mm seating height and 200 pins as a 'standard' format for SODIMMs, and 3.0 mm connector and 214 pins as a 'standard' format for MicroDIMMs for providing industry compatibility. As shown in Table 2, a MicroDIMM according to an embodiment of the present invention has a smaller seating height and a fewer number of pins than these formats. In particular, the MicroDIMM according to an embodiment of the present invention include a seat height between 3.1-3.8 mm (for example, 3.1 mm for a singled-sided DIMM or 3.8 for a double-sided DIMM, and supports 170 pins.

TABLE 2

|  | 200-pin SODIMM (related art) | 214-pin MicroDIMM (related art) | MicroDIMM according to an embodiment |
|---|---|---|---|
| Seating Height | 4.0 mm | 4.7-5.3 mm | 3.1-3.8 mm, e.g. 3.1 mm (single-sided) 3.8 mm (double-sided) |
| # of Pins | 200 | 214 | 170 |

However, reducing the number of pins of a MicroDIMM can potentially cause negative effects on the overall performance of the MicroDIMM. An embodiment of the present invention proposes reduction of selected pins without substantially negatively affecting the overall performance of a MicroDIMM module.

Figure 1:
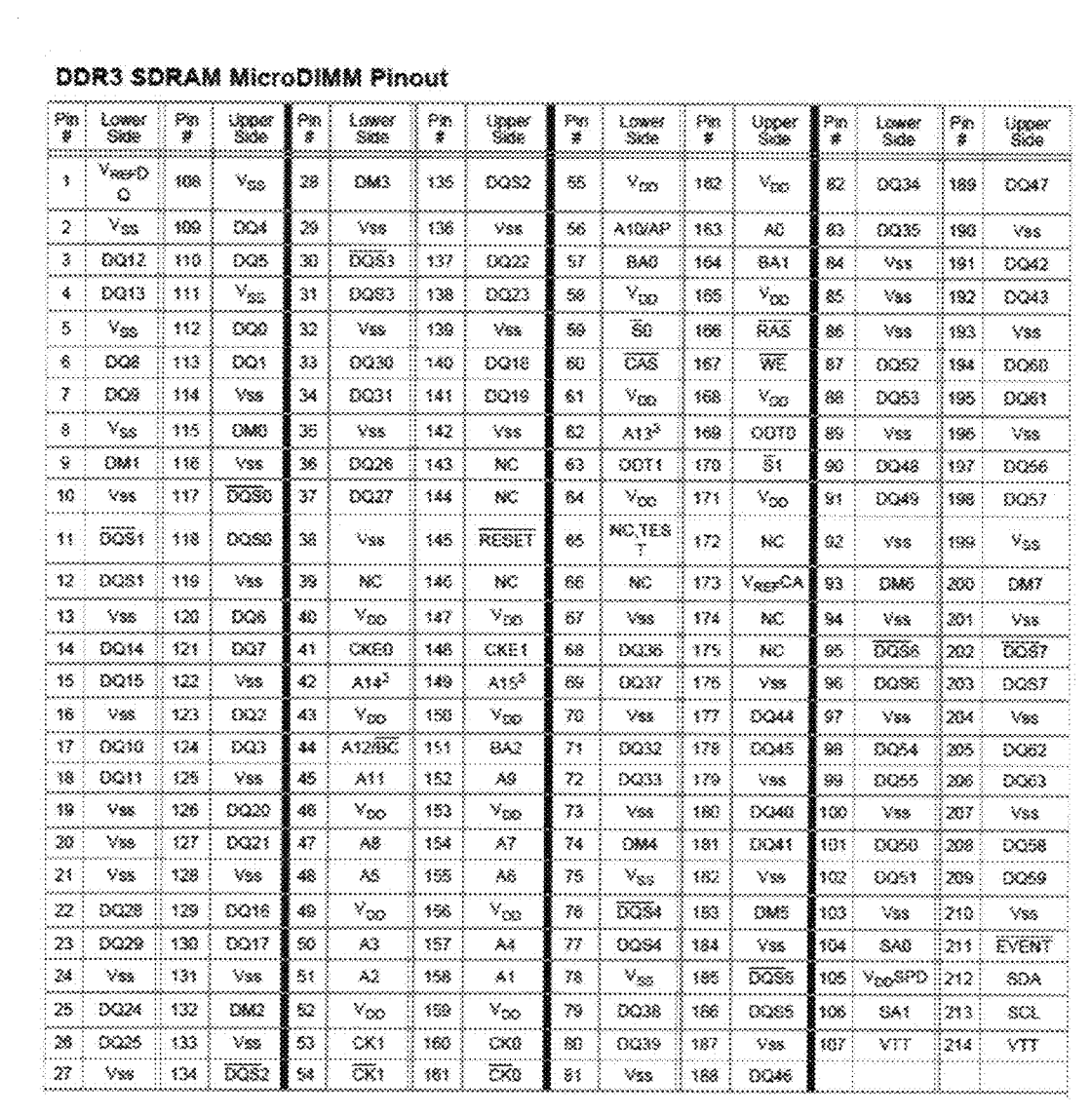

FIG. 5 is a chart reflecting a pin assignment for a 170-pin MicroDIMM module according to an embodiment of the present invention. FIG. 5 illustrates a reduced number of pins to 170 without compromising the performance of memory modules 18 (shown in FIG. 1). In particular, the number of ground (Vss) pin(s) preferably is reduced to 22 and the number of no-connect (N/C) pin(s) preferably is reduced to 1. As compared to the 240-pin assignment for a MicroDIMM according to the related art shown in FIG. 1 and Table 1, an embodiment of the present invention reduces the number of ground pins by thirty-four (34) and the number of no-connect pin(s) by ten (10). In addition, an embodiment of the present invention elects not to reduce the number of pins reserved for core and I/O power. Further, the number of pins reserved for termination voltage is not changed. The 170 pins have pin pitch of about 0.5 mm. JEDEC has established certain pin names. Table 3 reflects the pin count for the pin names according to an embodiment of the present invention.

TABLE 3

| Pin Name | Pin Count |
| --- | --- |
| DQ0~DQ63 | 64 |
| DQS0~DQS7 | 8 |
| DQS0#~DQS7# | 8 |
| A0~A15 | 16 |
| BA0~BA2 | 3 |
| S0#~S1# | 2 |
| RAS#, CAS#, WE# | 3 |
| DM[7:0] | 8 |
| CK0~CK1, CK0#~CK1# | 4 |
| CKE0~CKE1 | 2 |
| ODT0, ODT1 | 2 |
| RESET# | 1 |
| SCL, SDA, SA0~SA1, EVENT# | 5 |
| VDDSPD | 1 |
| VREFDQ, VREFCA | 2 |
| Vtt | 2 |
| VDD | 16 |
| VSS | 22 |
| N/C | 1 |

In FIG. 5 and Table 3, pin names DQ0~DQ64 refer to data input/output. Pin names DQS0~DQS7 refer to data strobe, and pin names DQS0#~DQS7# refer to data strobe complement. Pin names A0~A15 refer to address input. Pin names BA0~BA2 refer to SDRAM bank address. Pin names S0#~S1# refer to chip select. Pin names RAS#, CAS#, and WE# refer to row address strobe, column address strobe, and write enable, respectively.

In addition, pin names DM[7:0] refer to input data mask. Pin names CK0~CK1 and CK0#~CK1# refer to differential clock inputs. Pin names CKE0~CKE1 refer to clock enable. Pin names ODT0 and ODT1 refer to on die termination. Pin name RESET# refers to DDR3 SDRAM reset signal. Pin names SCL, SDA, SA0~SA1, and EVENT# refer to serial presence detect (SPD) clock input, SPD data input/output, SPD address, and thermal sensor event signal, respectively. Pin name VDDSPD refers to SPD power. Pin names VREFDQ and VREFCA refer to reference voltage for data, and reference voltage for commands and address, respectively. Pin name Vtt refers to termination voltage. Pin name VDD refers to core and I/O power, pin names VSS refers to ground, and pin name N/C refers no connect.

As shown in FIG. 5 and Table 3, a MicroDIMM module according to an embodiment of the present invention reserves sixty-four pins for data input/output, eight pins for data strobe, eight pins for data strobe complement, sixteen pins for address input, three for SDRAM bank address, two pins for chip select, one pin for row address strobe, one pin for column address strobe, and one pin for write enable. Further, eight pins are reserved for input data mask; four pins are reserved for differential clock inputs and differential clock input complement; two pins are reserved for clock enable, and two pins are reserved for on-die termination. One pin is reserved for each of reset signal, serial present detect clock input, serial present detect data input/output, and event signal, respectively. Two pins are reserved for serial present detect address. One pin is reserved for serial present detect power. One pin is reserved for each of reference voltage for data and reference voltage for commands and address, respectively. Two pins are reserved for termination voltage. Sixteen pins are reserved for core and input/output ("I/O") power. Lastly, the number of ground (Vss) pin(s) preferably is reduced to twenty-two, and the number of no-connect (N/C) pin(s) preferably is reduced to one.

As mentioned previously, reducing the number of pins of a MicroDIMM module (even if reducing only the number of ground pins) can potentially cause negative effects on the overall performance of the MicroDIMM module. For example, by reducing the number of ground pins, power delivery and ground return of a MicroDIMM module can be too low and become insufficient for the operation of the MicroDIMM module. An embodiment of the present invention relates to an improved connection with a reduced number of pins of a MicroDIMM module, while maintaining sufficient power delivery and ground return of the MicroDIMM module. The core and input/output ("I/O") power preferably may be 1.5V/1.35V.

Figure 6A:
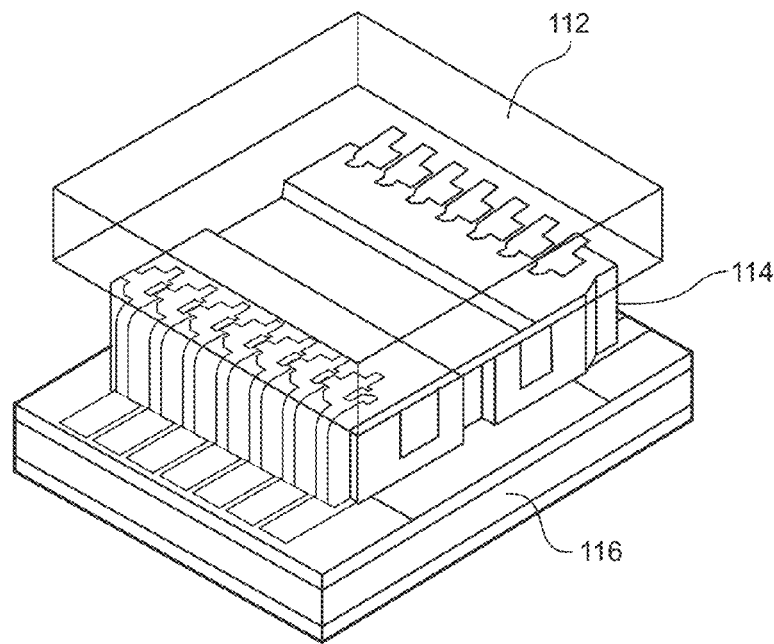
FIG. 6A is a perspective view illustrating a low-profile connector mated with a plug of a MicroDIMM PCB according to an embodiment of the present invention.
Figure 6B:
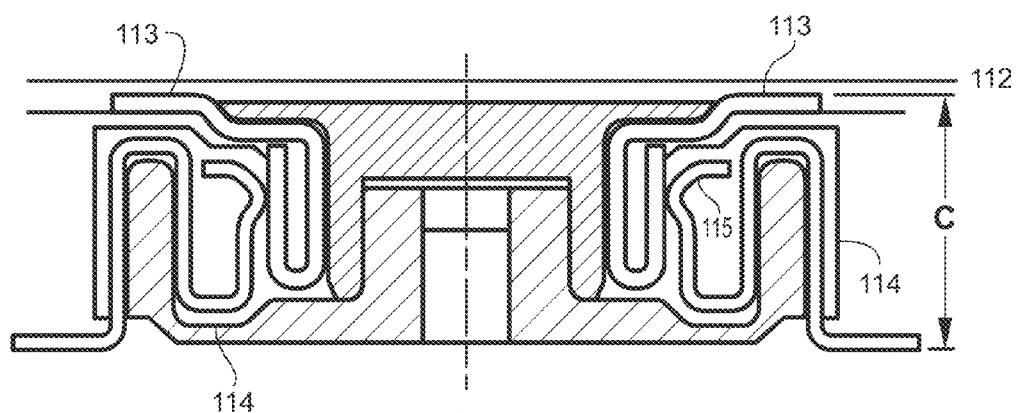
FIG. 6B is a cross-sectional view illustrating the low profile connector mated with the plug of a MicroDIMM illustrated in FIG. 6A.

FIG. 6A is a perspective view illustrating a low-profile connector mated with a plug of a MicroDIMM PCB according to an embodiment of the present invention, and FIG. 6B is a cross-sectional view illustrating the low profile connector mated with the plug of a MicroDIMM illustrated in FIG. 6A.

In FIG. 6A, a MicroDIMM PCB 112 is connected to a motherboard 116 through a low-profile connector 114. The low-profile connector 144 may be pre-affixed onto the motherboard 116. For example, the low-profile connector 114 may be soldered onto the motherboard 116 in advance. Further, the low-profile connector 114 has a z-height or a seat height C. For example, the low-profile connector 14 preferably has the z-height of about 1.5 mm.

The MicroDIMM PCB 112 includes a plug to be facing and mated with the low-profile connector 114. The plug includes an insulative portion. As illustrated in FIG. 6B, the insulative portion of the plug protrudes from a surface of the MicroDIMM PCB 12 and has a "⊓"-like or inverted "⊔"-like profile in its center when viewed from a cross-section view.

The low-profile connector 114 includes two sub-connectors. Each of the sub-connectors includes an insulative portion. The insulative portion of each of the two sub-connectors has a "J"-like profile and facing one another. As a result, the low-profile connector 114 has generally a "Ш"-like or inverted "m"-like profile with a gap in the center, when viewed from a cross-section view.

The profile of the MicroDIMM PCB plug is to mate with the profile of the low-profile connector 114. The combination of the "⊓"-like or inverted "⊔"-like profile of the plug and the "Ш"-like or inverted "m"-like profile with a gap in the center of the low-profile connector 114 provides improved structural enforcement for the connection between the MicroDIMM PCB 112 and the motherboard 116.

In addition, the 'peak' portions of the profile of the low-profile connector 114 may have different heights, and the 'valley' portions of these profiles may be curved or doubled curved. For example, FIG. 6B illustrates the height of the outer buttresses of each insulative portion of the low-profile connector 114 is higher than the height of the inner buttress of each insulative portion of the low-profile connector 114. Further, the valley of each insulative portion of the low-profile connector 114 may be uneven and include a dip.

The MicroDIMM PCB 12 further includes a first set of pins 113 along the outermost side surfaces of the "⊓"-like or inverted "⊔"-like profile of the plug. Each of the first set of pins 113 may be a cantilever pin and may have a hook portion hanging from the outermost side surfaces of the insulative portion of the plug. The hook portion of each of the first set of pins 113 provides space for the respective pin 113 to be pressed toward the insulative portion of the plug. For example, the hook portion extends downward almost the entire length of an outermost side surface of the "⊓"-like or inverted "⊔"-like profile of the plug but not the complete length of the outermost side surface. The hook portion subsequently has a "U"-like curve and then extends upward and parallel to almost the entire length of the outermost side surface, but not the complete length and ends prior to touching itself. Thus, the hook portion preferably forms almost a loop but not a closing loop.

The low-profile connector 114 includes a second set of pins 115. The second set of pins 115 extend around the outer buttresses of the "J"-like profile of each of the two sub-connectors and into the "valley" portions. Each of the second set of pins 115 may be a cantilever pin and may have a hook portion extending upward. The hook portion of each of the second set of pins 115 provides space for the respective pin 115 to be pressed toward the outer buttress of the "J"-like profile of the two sub-connectors. For example, the hook portion extends downward almost the entire length of an inner side surface of the outer buttresses of the "J"-like profile but not the complete length of the inner side surface. The hook portion subsequently has a "U"-like curve and then extends upward and somewhat parallel to the entire length of the outermost side surface. In addition, the hook portion may include a secondary hook or another curve as it extends upward.

As the z-height of the low-profile connector 14 is reduced, the pin length that can be implemented therewith also is reduced. Thus, as the low-profile connector 14 preferably has the z-height of about 1.5 mm, the pin length of the first set of pins 113 and the second set of pins 115 has to be less than 1.5 mm. However, a shortened pin length may potentially deteriorate pin contact thereof. Despite of the reduced pin length, the hook portion of each of the first set of pins 113 and the hook portion of each of the second set of pins 115 ensure contact of the pins and provide enhanced pin contacts for the connection between the MicroDIMM PCB 112 and the motherboard 116.

In addition, since the hook portion of each of the first set of pins 113 provides space for the respective pin 113 to be pressed toward the insulative portion of the plug, the hook portion of each of the first set of pins 113 also offers a margin for misalignment of the plug of the MicroDIMM PCB 112 and the low-profile connector 114. Similarly, the hook portion of each of the second set of pins 115 provides space for the respective pin 115 to be pressed toward the outer buttress of the "J"-like profile of the two sub-connectors. The hook portion of each of the second set of pins 115 offers further margin for misalignment of the plug of the MicroDIMM PCB 112 and the low-profile connector 114.

As the z-height of the low-profile connector 114 is reduced, the space available to accommodate structural support for the MicroDIMM PCB 112 also is reduced. Thus, as the low-profile connector 114 preferably has the z-height of about 1.5 mm, the vertical space available to accommodate structural support for the MicroDIMM PCB 112 has to be less than 1.5 mm. Despite of the reduced vertical space, the "⊓"-like or inverted "⊔"-like profile of the MicroDIMM PCB 112 and the "⊔"-like or inverted "m"-like profile with a gap in the center composed by the two sub-connectors of the low-profile connector 114 ensure structural support for the MicroDIMM PCB 112. These profiles provide enhanced structural stability for the MicroDIMM PCB 112 and the connection between the MicroDIMM PCB 112 and the motherboard 116.

Figure 9:
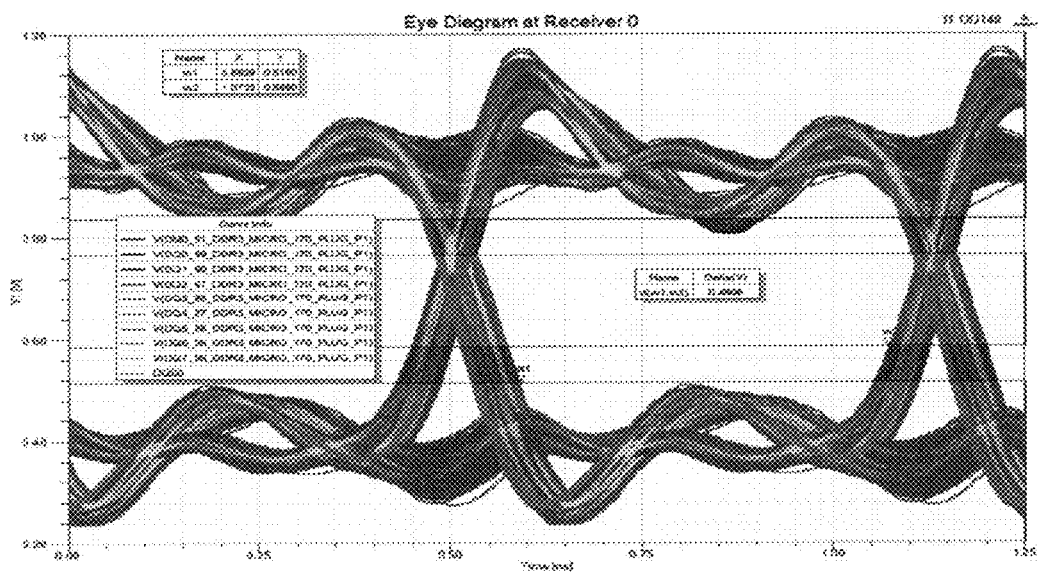
Figure 10:
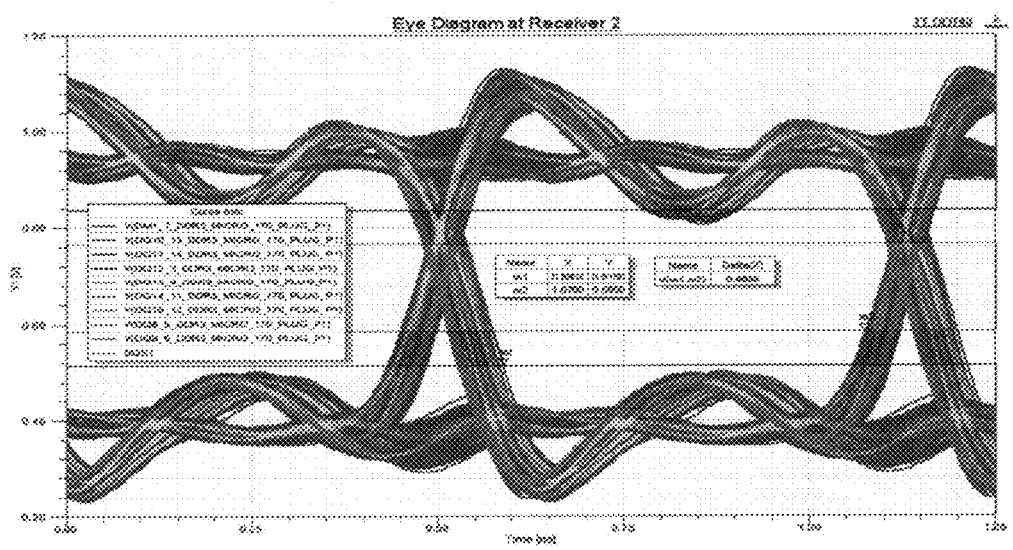
Figure 11:
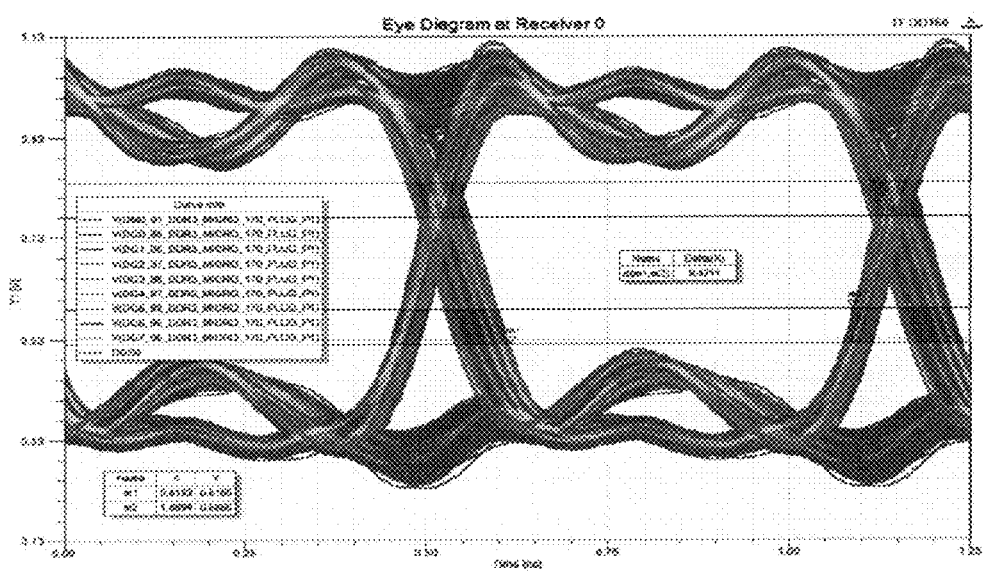
FIGS. 11 and 12 are time domain analysis of the MicroDIMM module according to an embodiment of the present invention.
Figure 12:
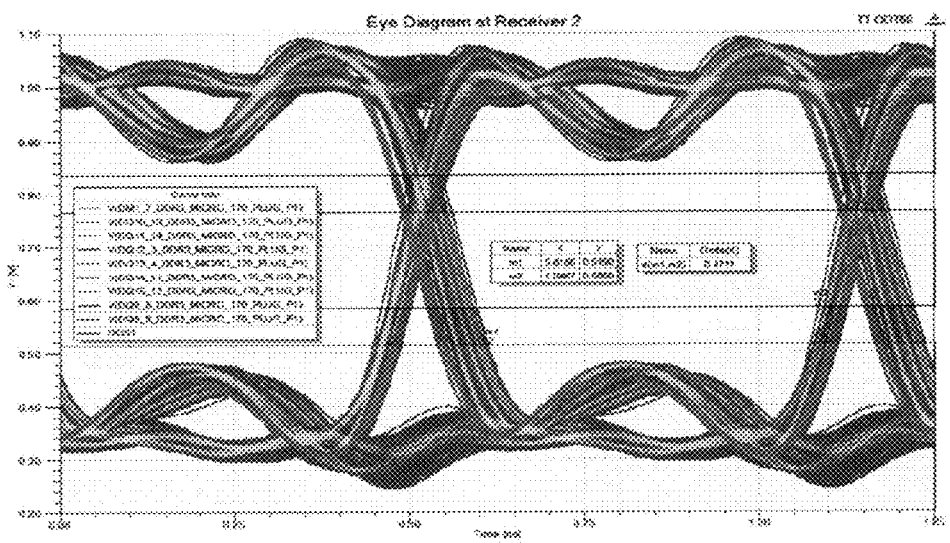
Figure 13:
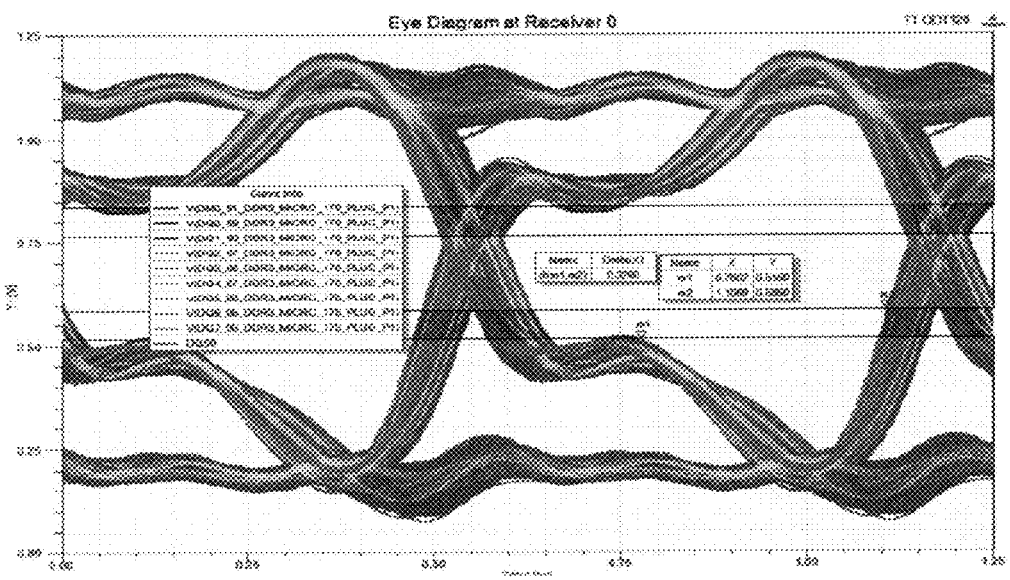
FIGS. 13 and 14 are time domain analysis of the MicroDIMM module according to an embodiment of the present invention.
Figure 14:
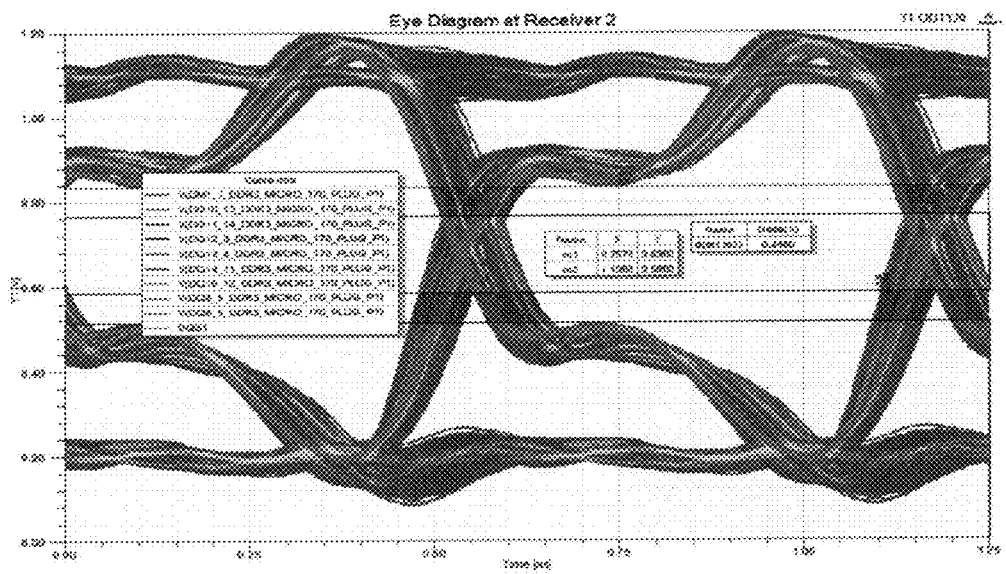

FIGS. 7-10 are time domain analysis of the MicroDIMM module according to an embodiment of the present invention, FIGS. 11 and 12 are time domain analysis of the MicroDIMM module according to an embodiment of the present invention, and FIGS. 13 and 14 are time domain analysis of the MicroDIMM module according to an embodiment of the present invention.

The dimension reduction of the low-profile connector 114 can potentially increase data interference. Also, the increase of the MicroDIMM data transfer rate can cause impedance mismatch between the components or pins. Accordingly, an embodiment of the present invention sets the pin pitch to be 0.5 mm. The 0.5 pin pitch can be used for data transfer rate of at least 1600 Mbps and when the writing voltage is 1.5 V or 1.35V while maintaining proper impedance.

Figure 7:
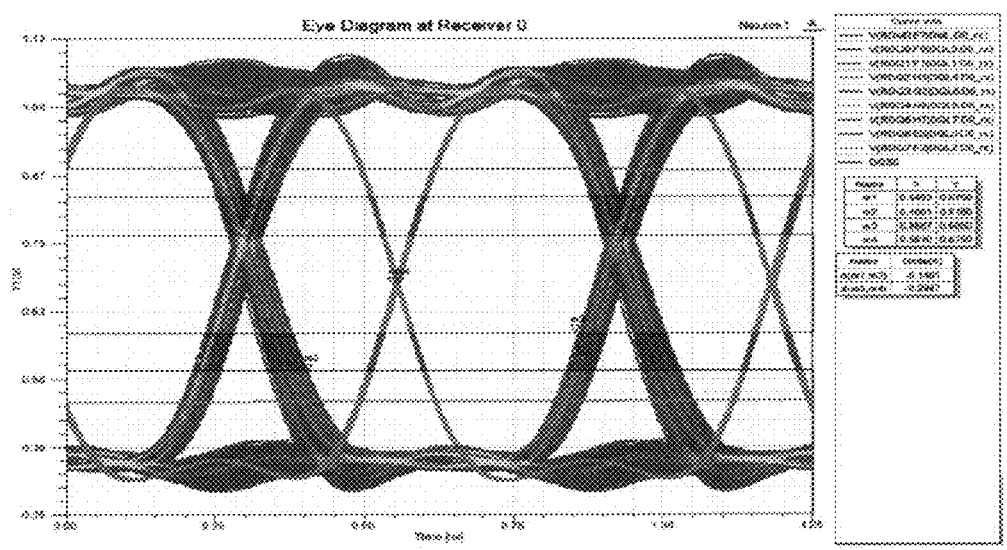
FIGS. 7-10 are time domain analysis of the MicroDIMM module according to an embodiment of the present invention.
Figure 8:
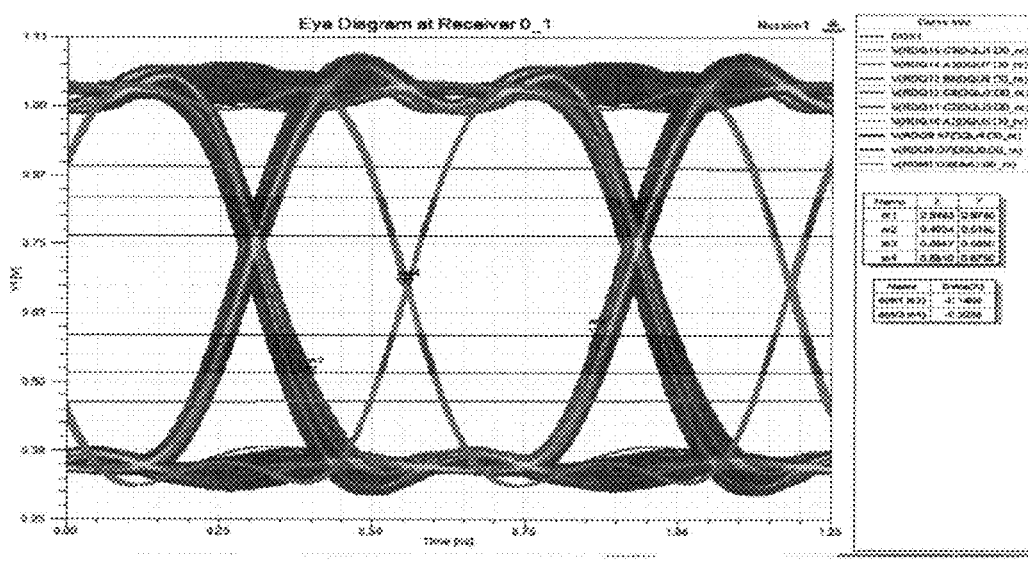

Time domain analysis generally provides more realistic estimate to the signal quality as the information on driver and receiver circuits along with sensitive parasitic effects like coupling and reflections can be captured. FIG. 7 reflects time domain analysis of eight data strobe (DQ0-DQ7), data strobe complement (DQS0) and input data mask (DM0), and FIG. 8 reflects time domain analysis of another eight data strobe (DQ8-DQ15), another data strobe complement (DQS1) and another input data mask (DM1). The MicroDIMM is analyzed at Input/Output Buffer Information Specification (IBIS) model. In addition, the D0 of MicroDIMM is driven with a read voltage at 1.35 V and data transfer rate of 1600 Mbps. In particular, FIGS. 7 and 8 respectively show an eye at the pins. The vertical and horizontal eye openings give an idea of the attenuation and inter-symbol interference (ISI) in the channel.

FIG. 9 reflects time domain analysis of the first eight data strobe (DQ0-DQ7), the first data strobe complement (DQS0) and the first input data mask (DM0) at bit width of 480 ps, and FIG. 10 reflects time domain analysis of the second eight data strobe (DQ8-DQ15), the second data strobe complement (DQS1) and the second input data mask (DM1) at bit width of 486 ps. The MicroDIMM is analyzed at IBIS model. In addition, the D0 of MicroDIMM is driven with a read voltage at 1.35 V and data transfer rate of 1600 Mbps. In particular, FIGS. 9 and 10 respectively show an eye at these pins.

FIG. 11 reflects time domain analysis of the first eight data strobe (DQ0-DQ7), the first data strobe complement (DQS0) and the first input data mask (DM0), and FIG. 12 reflects time domain analysis of the second eight data strobe (DQ8-DQ15), the second data strobe complement (DQS1) and the second input data mask (DM1). The MicroDIMM is analyzed at IBIS model. In addition, the D0 of MicroDIMM is driven with a read voltage at 1.35 V, data transfer rate of 1600 Mbps and bit width of 471 ps. In particular, FIGS. 11 and 12 respectively show an eye at these pins.

FIG. 13 reflects time domain analysis of the first eight data strobe (DQ0-DQ7), the first data strobe complement (DQS0) and the first input data mask (DM0) at bit width of 326 ps, and FIG. 14 reflects time domain analysis of the second eight data strobe (DQ8-DQ15), the second data strobe complement (DQS1) and the second input data mask (DM1) at bit width of 348 ps. The MicroDIMM is analyzed at IBIS model. In addition, the D0 of MicroDIMM is driven with a read voltage at 1.35 V and data transfer rate of 1600 Mbps. In particular, FIGS. 13 and 14 respectively show an eye at these pins.

Collectively FIGS. 7-14 reflects proper impedance match is accomplished for the low-profile connector 114 with 170 pins at the pin pitch of 0.5 mm, where the low-profile connector 114 preferably has the z-height of about 1.5 mm. In particular, proper impedance match can be accomplished when the MicroDIMM is driven at about 1.35V and operated with a data transfer rate of at least 1600 Mbps. Further, these analysis confirm sufficient power delivery for the operation of the MicroDIMM.

Figure 15:
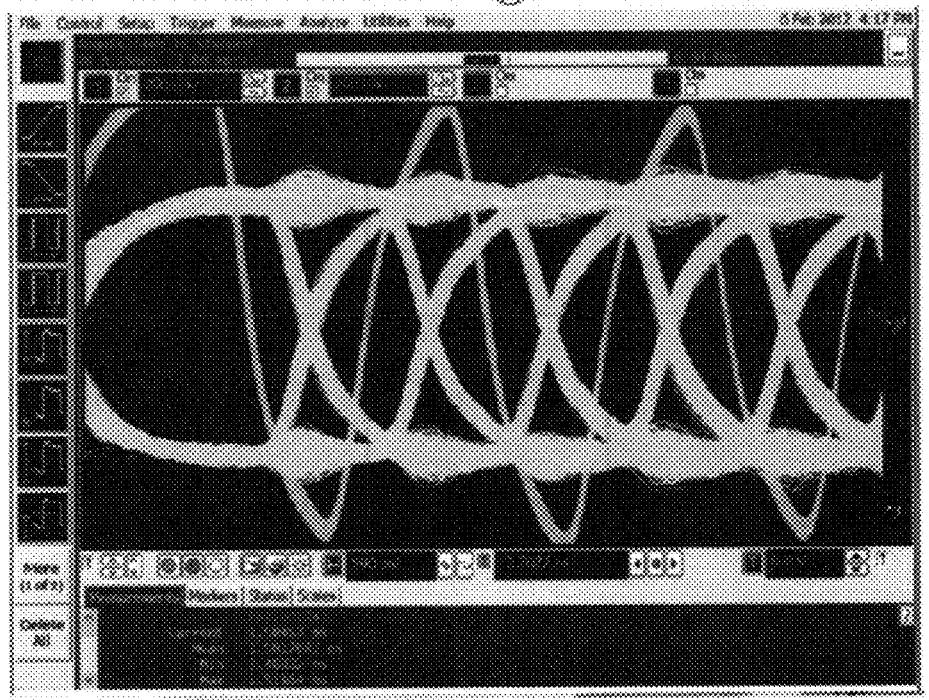
FIGS. 15 and 16 are time domain analysis of the MicroDIMM module according to an embodiment of the present invention.
Figure 16:
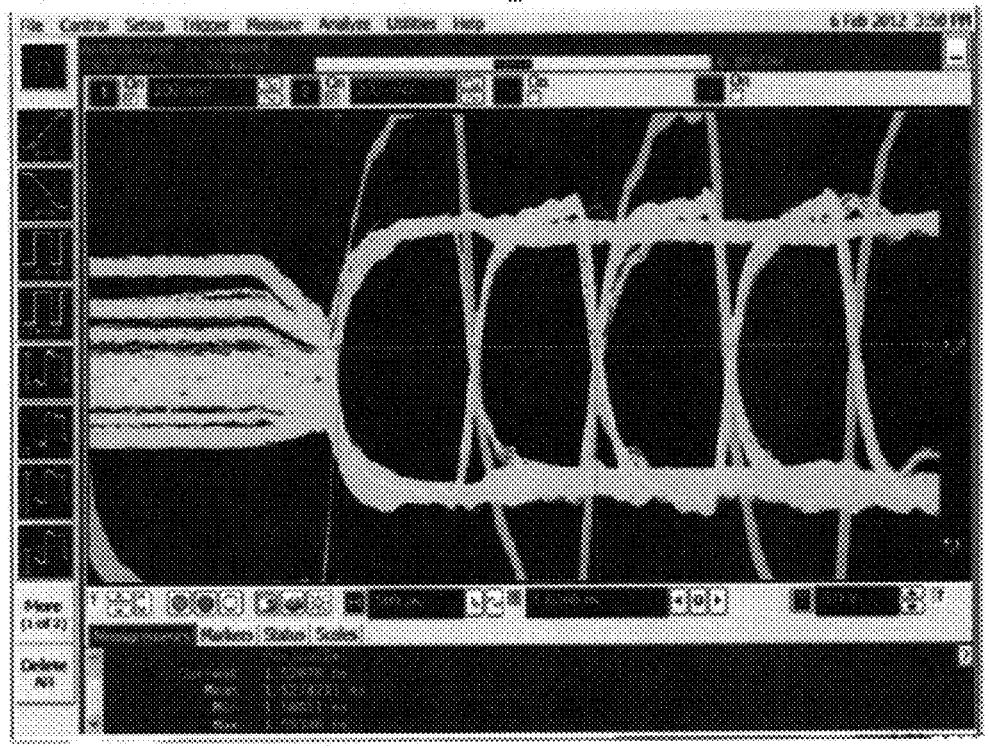

FIGS. 15 and 16 are time domain analysis of the MicroDIMM module according to an embodiment of the present invention. FIG. 15 reflects time domain analysis during WRITE data and when operating at 1333 MT/second at 1.5 V, while FIG. 16 reflects time domain analysis during READ data and when operating at 1333 MT/second at 1.5 V. In particular, FIGS. 15 and 16 respectively show an eye at these pins when driving the MicroDIMM using 1.5 V at 1333 Mpbs data transfer rate and confirms sufficient power delivery and proper impedance match.

Figure 17:
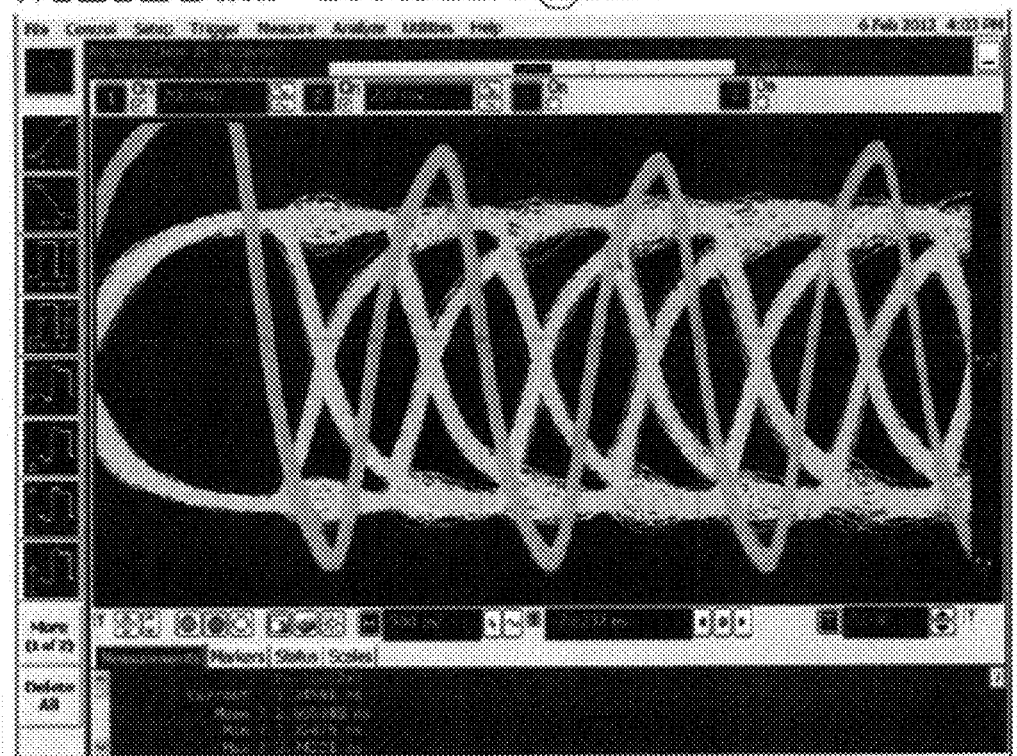
FIGS. 17 and 18 are time domain analysis of the MicroDIMM module according to an embodiment of the present invention.
Figure 18:
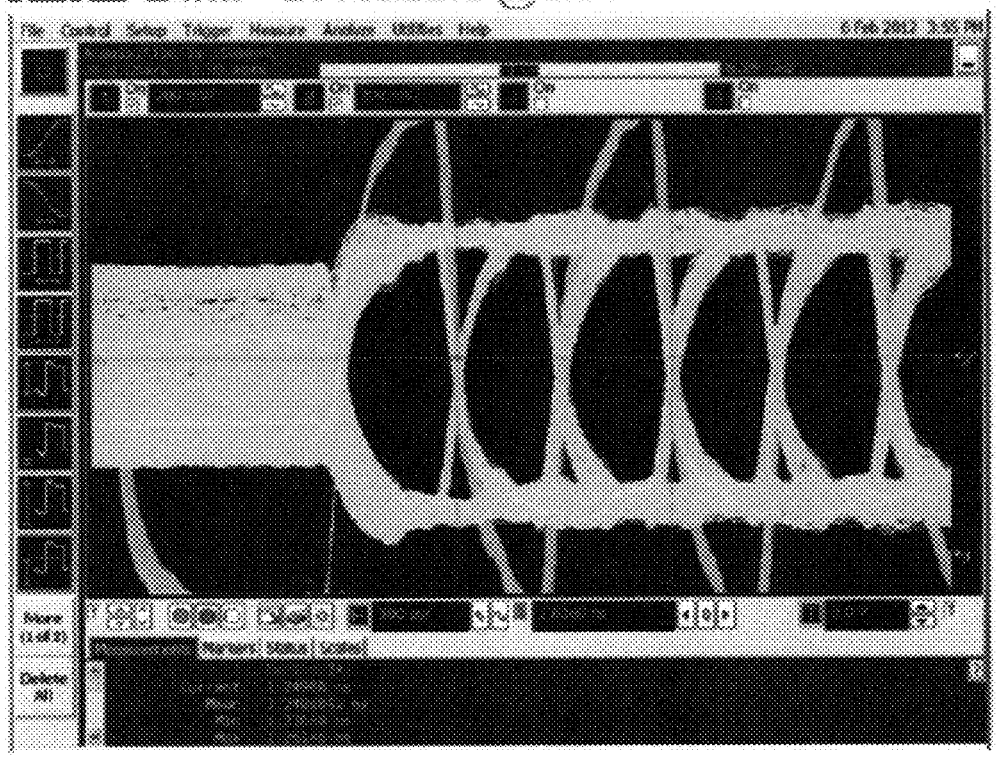

FIGS. 17 and 18 are time domain analysis of the MicroDIMM module according to an embodiment of the present invention. FIG. 17 reflects time domain analysis during WRITE data and when operating at 1600 MT/second at 1.5 V, while FIG. 18 reflects time domain analysis during READ data and when operating at 1600 MT/second at 1.5 V. In particular, FIGS. 17 and 18 respectively show an eye at these pins when driving the MicroDIMM using 1.5 V at 1600 Mpbs data transfer rate and confirms sufficient power delivery and proper impedance match.

Figure 19:
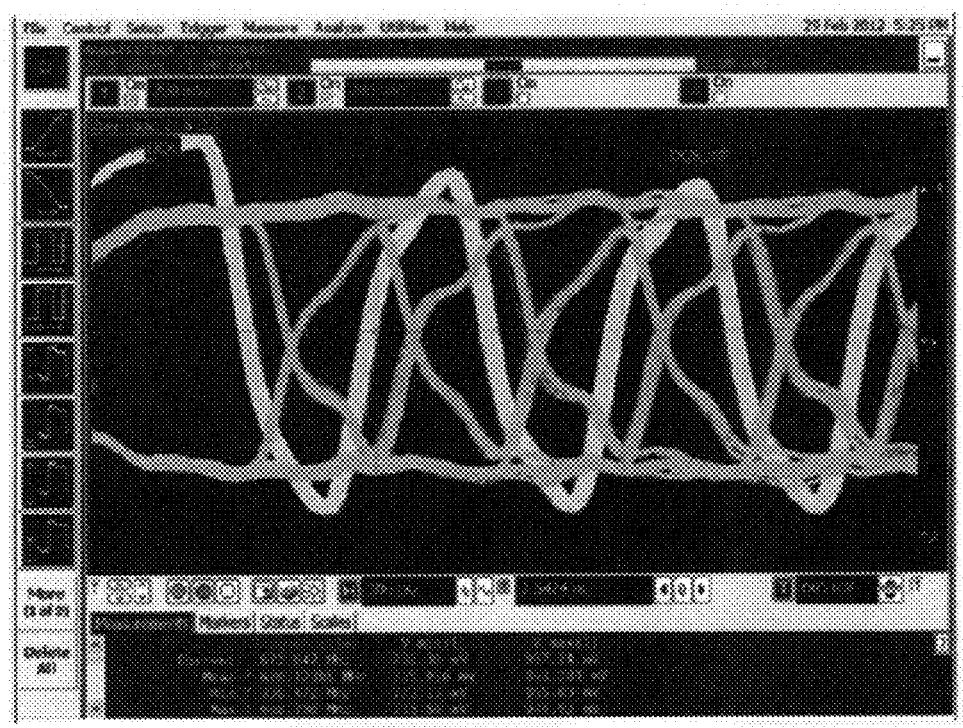
FIGS. 19 and 20 are time domain analysis of the MicroDIMM module according to an embodiment of the present invention.
Figure 20:
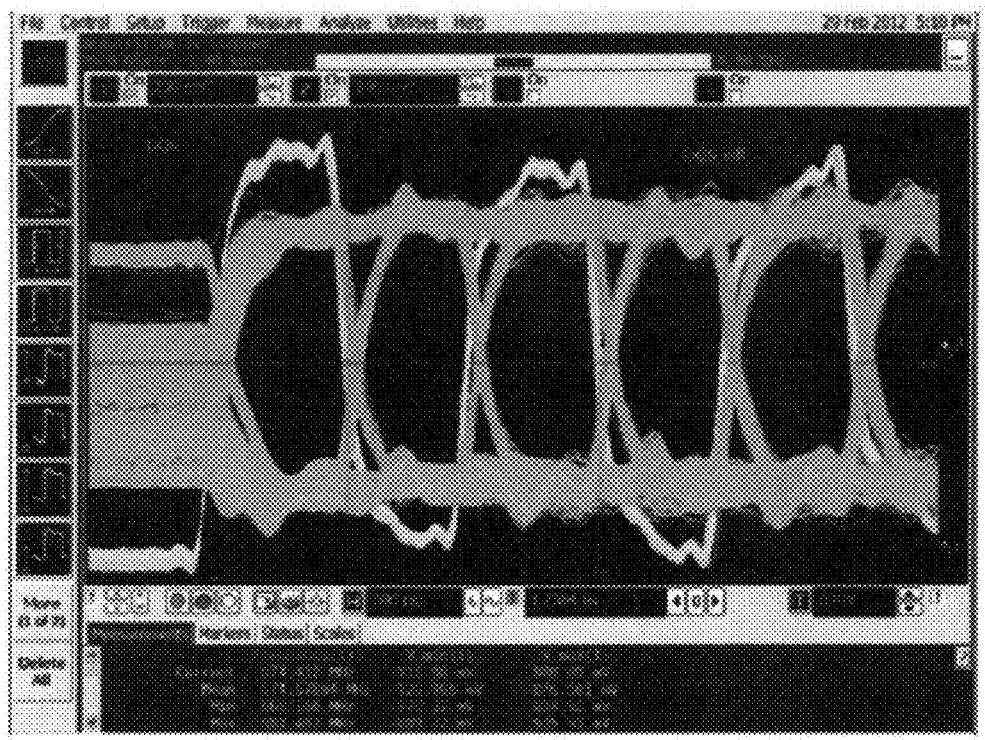

FIGS. 19 and 20 are time domain analysis of the MicroDIMM module according to an embodiment of the present invention. FIG. 19 reflects time domain analysis during WRITE data and when operating at 1333 MT/second at 1.35 V, while FIG. 20 reflects time domain analysis during READ data and when operating at 1333 MT/second at 1.35 V. In particular, FIGS. 19 and 20 respectively show an eye at these pins when driving the MicroDIMM using 1.35 V at 1333 Mpbs data transfer rate and confirms sufficient power delivery and proper impedance match.

Figure 21:
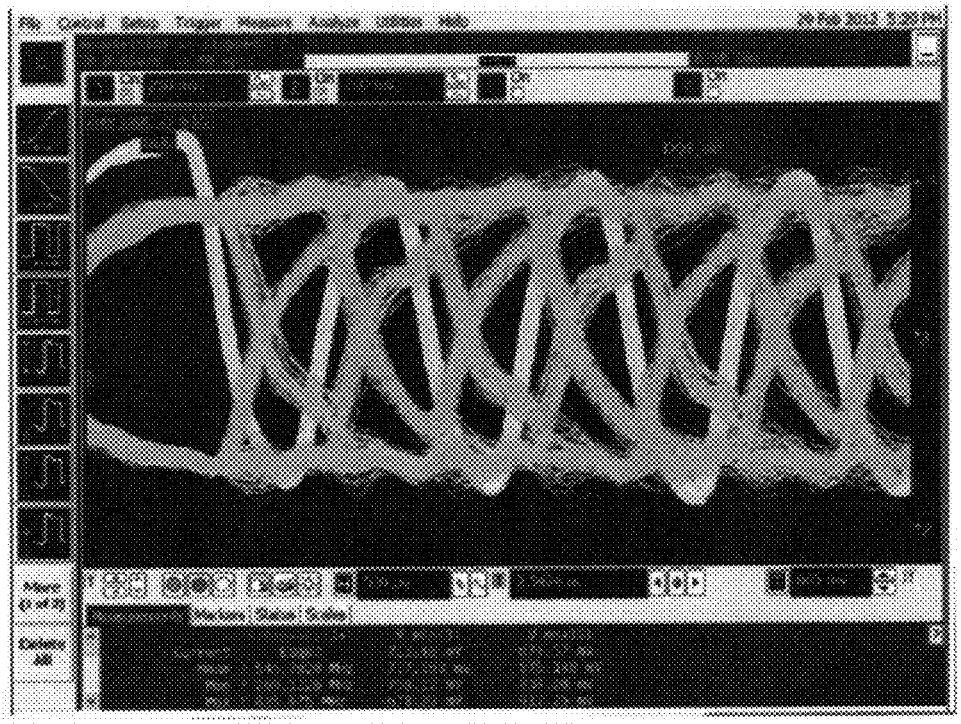
FIGS. 21 and 22 are time domain analysis of the MicroDIMM module according to an embodiment of the present invention.
Figure 22:
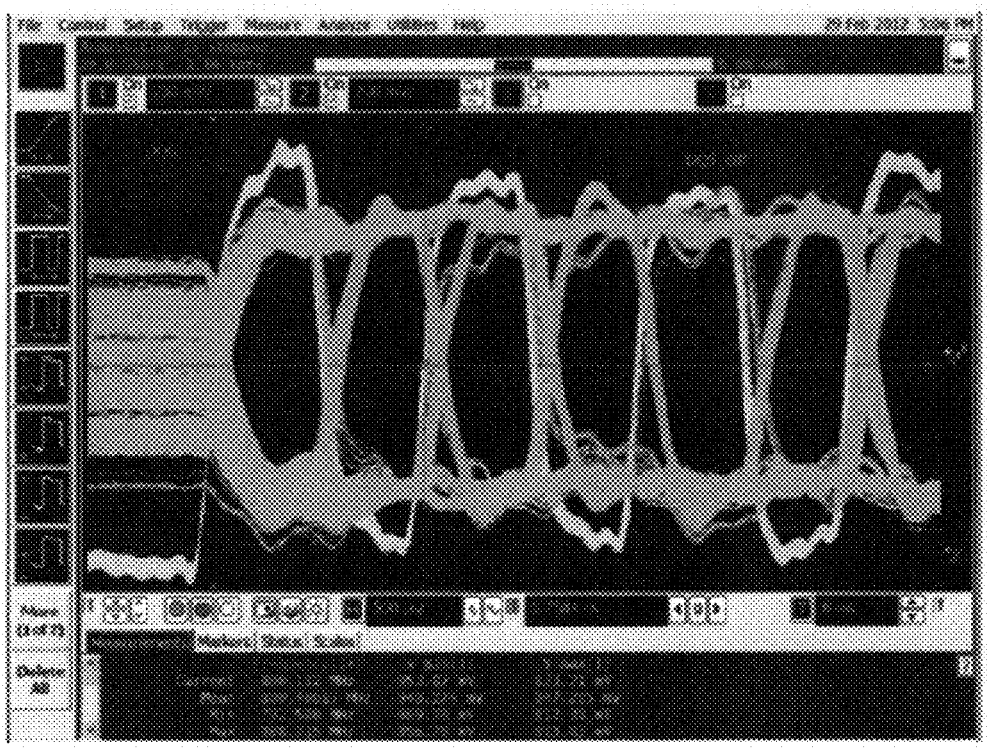

FIGS. 21 and 22 are time domain analysis of the MicroDIMM module according to an embodiment of the present invention. FIG. 21 reflects time domain analysis during WRITE data and when operating at 1600 MT/second at 1.35 V, while FIG. 22 reflects time domain analysis during READ data and when operating at 1600 MT/second at 1.35 V. In particular, FIGS. 21 and 22 respectively show an eye at these pins when driving the MicroDIMM using 1.35 V at 1600 Mpbs data transfer rate and confirms sufficient power delivery and proper impedance match.

While certain embodiments of the invention are described above, it should be understood that the invention can be embodied and configured in many different ways without departing from the spirit and scope of the invention.

While the subject matter has been described in detail with reference to exemplary embodiments thereof, it will be apparent to one skilled in the art that various changes can be made, and equivalents employed, without departing from the scope of the invention. All related art references discussed in the above Description of the Related Art section are hereby incorporated by reference in their entirety.

It will be apparent to those skilled in the art that various modifications and variations can be made in the memory module of the embodiments of the invention without departing from the spirit or scope of the invention. Thus, it is intended that embodiments of the invention cover the modifications and variations of this invention provided they come within the scope of the appended claims and their equivalents.

What is claimed is:

1. A module comprising:
   a printed circuit board including a plug and at least one memory component thereon; and
   a connector for connecting the printed circuit board to a motherboard, the connector being mateable with the plug on the printed circuit board and having a z-height of no more than about 1.5 mm, wherein each of the plug and the connector includes a first plurality and a second plurality of pins, respectively, and the number of the first plurality pins allocated for VSS is twenty-two and the number of the first plurality pins allocated for VDD is sixteen.

2. The module of claim 1, wherein the plug includes an insulative portion protruding from a surface of the printed circuit board and having a "⊓"-like or inverted "凹"-like profile in its center.

3. The module of claim 1, wherein each of the first and second plurality of pins has one hundred seventy pins, respectively.

4. The module of claim 1, wherein each of the first and second plurality of pins includes "U"-like compressive portion, and the "U"-like curve portion of one of the first plurality of pins compresses against the "U"-like curve portion of one of the second plurality of pins, when the plug and connector are mated.

5. The module of claim 3, wherein the pitch of the pins of the plug is about 0.5 mm.

6. The module of claim 1, wherein the connector includes two sub-connectors, each of the two sub-connectors has 85 of the second plurality of pins.

7. The module of claim 6, wherein each of the 85 pins is a cantilever pin.

8. The module of claim 6, wherein each of the 85 pins includes a hook portion.

9. The module of claim 1, wherein the thickness of the printed circuit board is no more than about 3.7 mm maximum.

10. A MicroDIMM comprising:
    a printed circuit board;
    a plug on the printed circuit board; and
    at least one memory component on the printed circuit board,
    wherein the plug has a z-height less than 1.5 mm, and
    wherein the plug includes pins and the number of pins allocated for VSS is twenty-two and the number of pins allocated for VDD is sixteen.

11. The MicroDIMM of claim 10, wherein the plug includes an insulative portion protruding from a surface of the printed circuit board and having a "⊓"-like or inverted "凹"-like profile in its center.

12. The MicroDIMM of claim 10, wherein the plug has one hundred seventy pins.

13. The MicroDIMM of claim 12, wherein each of the pins of the plug includes a hook portion.

14. The MicroDIMM of claim 12, wherein the pitch of the pins of the plug is about 0.5 mm.

15. A plug for providing connection between a printed circuit board and a motherboard, comprising:
    a z-height of no more than about 1.5 mm;
    an insulative portion having a "⊓"-like or inverted "凹"-like profile in its middle region; and
    a plurality of pins, wherein each of the pins includes a hook portion, wherein the hook portion extends on and along an outermost side surface of the "□"-like or inverted "凹"-like portion and into a "U"-like curve, where the "U"-like curve is compressible.

16. The plug of claim 15, wherein the plug includes two sub-connectors, each of the two sub-connectors has 85 pins.

17. The plug of claim 15, wherein the number of pins allocated for VSS is twenty-two and the number of pins allocated for VDD is sixteen.

18. The module of claim 2, wherein each of the first and second plurality of pins includes a "U"-like compressive portion, and the "U"-like curve portion of one of the first plurality of pins presses against the "U"-like curve portion of one of the second plurality of pins, when the plug and connector are mated.

19. The module of claim 1, wherein each of the first and second plurality of pins includes a "U"-like compressive portion, and the "U"-like curve portion of one of the plug pins presses against the "U"-like curve portion of one of the connector pins, when the plug and connector are mated.

* * * * *